United States Patent [19]
Huang

[11] Patent Number: 5,914,996
[45] Date of Patent: Jun. 22, 1999

[54] MULTIPLE CLOCK FREQUENCY DIVIDER WITH FIFTY PERCENT DUTY CYCLE OUTPUT

[75] Inventor: Samson Huang, Cupertino, Calif.

[73] Assignee: Intel Corporation, Santa Clara, Calif.

[21] Appl. No.: 08/799,597

[22] Filed: Feb. 12, 1997

[51] Int. Cl.[6] .................................................. H03K 21/00
[52] U.S. Cl. .............................. 377/39; 377/47; 327/115; 327/117; 327/175
[58] Field of Search .................................. 327/115, 117, 327/175, 299; 377/39, 47

[56] References Cited

U.S. PATENT DOCUMENTS

| | | | |
|---|---|---|---|
| 4,807,266 | 2/1989 | Taylor | 327/115 |
| 5,177,771 | 1/1993 | Glassburn | 377/39 |
| 5,256,994 | 10/1993 | Langendorf | 331/16 |
| 5,365,182 | 11/1994 | King | 327/115 |
| 5,371,772 | 12/1994 | Al-Khairi | 377/47 |

*Primary Examiner*—Margaret R. Wambach
*Attorney, Agent, or Firm*—Jeffery S. Draeger

[57] ABSTRACT

A clock divider circuit and a system using the same. The clock divider circuit has a clock input coupled to receive an input clock signal having an input clock frequency. Clock division logic generates an output clock signal having a fifty percent duty cycle and an output clock frequency which is an odd fraction of the input clock frequency. The clock division logic generates both the rising and the falling clock edges of the output clock signal from the input clock signal. The system disclosed includes a processor operating at a first frequency and a memory circuit coupled to exchange data with the processor. The processor includes a clock division circuit coupled to receive a first clock signal and to generate a second clock signal at a second frequency which is an odd fraction of the first frequency. The processor also includes an input/output buffer coupled to exchange data with the memory circuit. The memory circuit is coupled to receive the second clock signal to synchronize transmission of data between the processor and the memory circuit.

21 Claims, 6 Drawing Sheets

MULTIPLE CLOCK FREQUENCY DIVIDER WITH FIFTY PERCENT DUTY CYCLE OUTPUT

BACKGROUND OF THE INVENTION

1. Field of the Invention

The present invention relates to circuitry for use in electronic systems having portions operating at different clock frequencies. More particularly, the present invention relates to circuitry for generating clock signals of varying frequency for use by different components or subcomponents within processor systems.

2. Art Background

Computer systems and other microprocessor controlled systems are often divided into groups of functionally related components which have a common clock line carrying a signal that varies at a predetermined frequency. The various components in the computer system receive the clock signal and typically carry out their operations during one or more clock cycles.

In some prior art systems, all major components operate at the frequency of the clock signal; however, more advanced systems often use multiple operating frequencies to improve the throughput of individual functional units. For example, a processor may have a bus interface that operates at one-half, one-third, or some other multiple of the processor operating frequency. A fractional speed memory interface is often necessary because bus drivers may not be able to drive interconnect lines external to the individual integrated circuit at the processor operating frequency. Despite being integrated into the same package, module, or even the same die, some portions of circuitry still may not be able to operate in lock-step with others and thus require separate clock signals.

One common aim in designing a multiple clock system is to avoid clock skew. Skew refers to the phase difference between a reference clock and the clock signal seen by each of the components. This phase difference may occur due to non-uniform propagation delays in the circuitry and routing. As clock frequencies increase, the allowable skew must decrease to allow the same percentage of each clock period for signal propagation.

A phase locked loop (PLL) is a circuit often used for clock generation where low clock skew is desired. A PLL utilizes a voltage controlled oscillator (VCO) and a phase comparator to match the phase of the PLL output to that of a reference clock. This arrangement can perform frequency multiplication by using a counter or a divider in the feedback path for the PLL output. Such a technique, however, can generate only whole multiples of the input clock frequency.

In those computer and microprocessor systems where some components operate at a slower clock frequency than the reference clock, a division of the clock frequency is needed. One odd division technique that may achieve a fifty percent duty cycle doubles the frequency (using the PLL based multiplication scheme described above) and then divides by twice the value of the desired odd divisor. A more elaborate scheme using a divider in conjunction with a PLL/VCO loop may be used to achieve clock multiplication by any fraction D/N. Unfortunately, such implementations utilize a phase locked loop and other analog circuitry which adds expense and complexity to an integrated circuit.

Digital division circuits, on the other hand, are often limited to division by even integers. Some digital dividers which are capable of odd division generate a clock signal that varies from a fifty percent duty cycle by one half of a clock cycle because odd division with a fifty percent duty cycle requires alternately aligning the generated clock to the rising and falling edges of the input clock. Other prior art digital dividers which are capable of odd division and do generate clock signals accurate to the proper half cycle still may compromise their duty cycle symmetry by using different clock signals to generate rising and falling edges or by using uneven numbers of gates in the logical paths which generate the rising and falling edges of the output clock.

As interconnect lengths decrease and the clock frequencies increase, the need to minimize clock skew may rise. The receiving hardware also often relies on even duty cycles to perform necessary tasks and meet stringent timing requirements. Consequently, closer control over the relative timing between the original and divided down clocks than provided by the prior art may be necessary in order to provide sufficient time for communication between devices and to reduce the time reserved as guardband.

Additionally, prior art techniques are often limited to one phase relationship between the input and generated clock signals. In other words, one edge of the generated clock signal is limited to being aligned with a specific edge of the input clock signal. While an inverter could be added in such designs to get the opposite polarity, the versatility of choosing polarity during operation is not available. Moreover, further increasing gates counts or logic between the clock controlled gates and the clock output produces further undesirable skew variations since each circuitry element introduces a delay which may vary over temperature and operating conditions.

Thus, the prior art fails to provide fifty percent duty cycle clock division circuitry which adequately addresses the needs of high performance computer systems. Some prior art systems require complex analog circuitries to effectuate such division. Others accomplish such division using digital circuitry, but may not provide adequate skew, polarity, and phase control.

SUMMARY

The present disclosure describes a clock divider circuit. The clock divider circuit has a clock input coupled to receive an input clock signal having an input clock frequency. Clock division logic generates an output clock signal having approximately a fifty percent duty cycle and an output clock frequency which is an odd fraction of the input clock frequency. The clock division logic generates both the rising and the falling clock edges of the output clock signal from the input clock signal.

A system also disclosed includes a processor operating at a first frequency and a memory circuit coupled to exchange data with the processor. The processor includes a clock division circuit coupled to receive a first clock signal and to generate a second clock signal at a second frequency which is an odd fraction of the first frequency. The processor also includes an input/output buffer coupled to exchange data with the memory circuit. The memory circuit is coupled to receive the second clock signal to synchronize transmission of data between the processor and the memory circuit.

BRIEF DESCRIPTION OF THE FIGURES

The present invention is illustrated by way of example and not limitation in the figures of the accompanying drawings.

DETAILED DESCRIPTION

The present invention provides a multiple clock frequency divider with approximately a fifty percent duty cycle output. In the following description, numerous specific details such as signal names, state names, gate level implementations, and system configurations are set forth in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the included functional descriptions, will be able to implement the necessary logic circuits without undue experimentation.

As will be discussed further below, the present invention provides a clock divider which produces a clock signal with approximately a fifty percent duty cycle and an output frequency which is an odd submultiple of the input frequency. In one embodiment, rising and falling edges of the output clock signal are generated through an equal number of gate delays from the input clock signal. The clock divider may also operate in a second mode producing an even submultiple of the input frequency. Additionally, the clock divider may have an invert input to control the phase relationship to the input clock and a reset input to allow multiple clock dividers to operate in concert in a system configuration.

Figure 1:
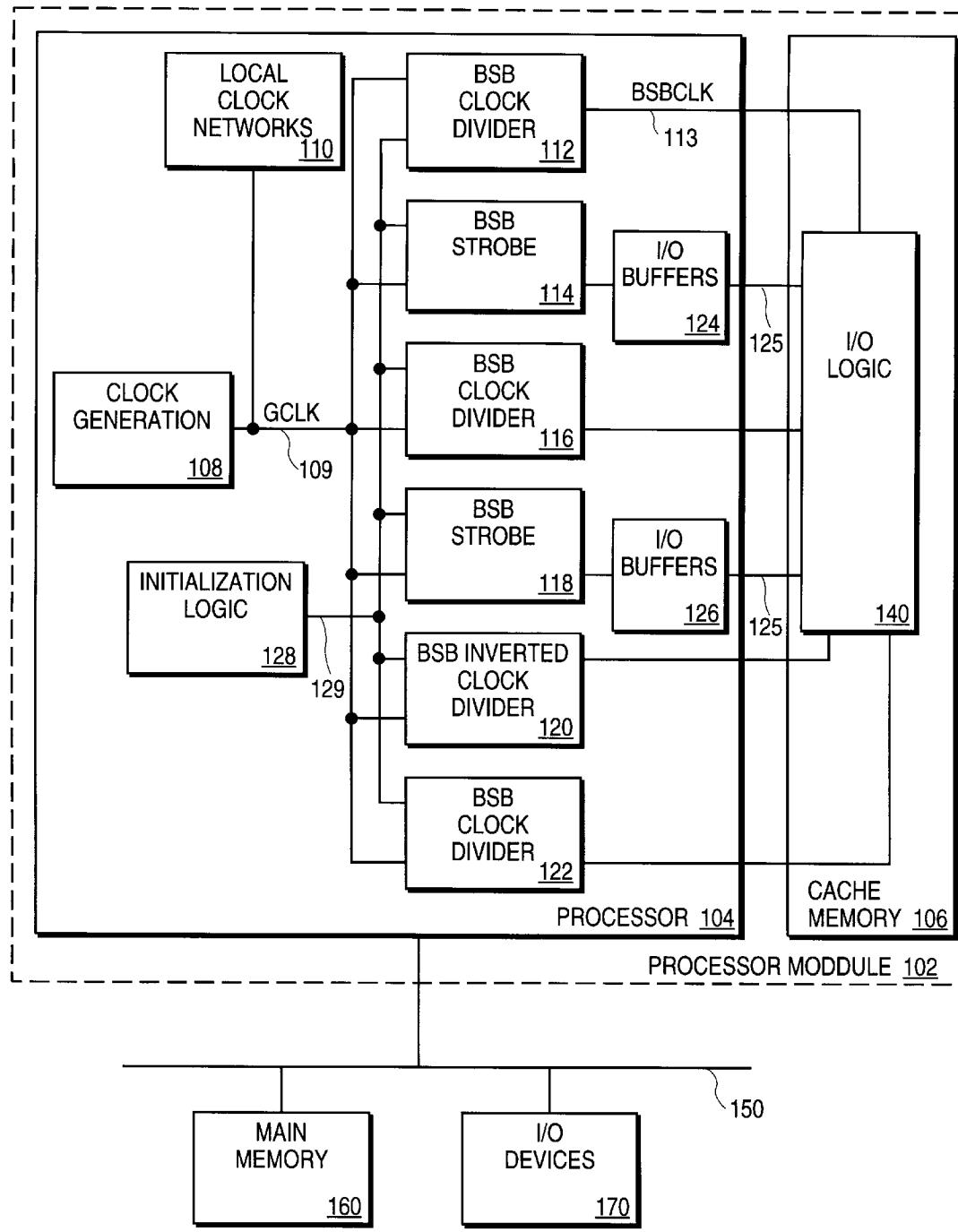
FIG. 1 illustrates an embodiment of a system of the present invention.

One system utilizing a number of clock dividers is illustrated in FIG. 1. This system includes a processor module 102 which includes a processor 104 and a cache memory 106. In one embodiment, the processor 104 and the cache memory 106 are tightly coupled via a back side bus and are packaged together in a dual cavity package. The processor 104 and the processor module 102 are connected to a bus 150 to allow interaction with a main memory 160 and other system I/O devices 170. These I/O devices may include a keyboard, a monitor, a mouse, a disk drive, and other I/O devices as are well known in the art.

It should be noted that the system may be configured differently for different applications. Although the processor 104 is represented by a single box, many suitable configurations may be used. For example, the processor 104 and the cache memory 106 can be split into separate devices. Additionally, the clock divider circuit and the processor/cache memory interface described herein may be used as an interface between other components in other system arrangements.

In the illustrated embodiment, although the processor 104 and the cache memory 106 are tightly coupled, their interface does not operate at as high of a frequency as logic internal to processor 104. Instead, a series of clock dividers, back side bus clock dividers 112, 116, 120, and 122, generate clocks such as BSBCLK 113 to facilitate communication at a fraction of the frequency of a global clock signal GCLK 109. With the additional assistance of back side bus strobe generation circuits 114 and 118, data, addresses, and control signals are exchanged between I/O buffers 124 and 126 and I/O logic 140 of the cache memory 106 via the back side bus 125.

The use of multiple clock dividers and multiple strobe generators reduces the number of signals which are latched or generated based on each individual clock or strobe signal. This is advantageous because the distance each clock signal must travel to reach the appropriate I/O circuitry is reduced, thus reducing the amount of skew introduced by propagation delay. Additionally, an inverted clock generated by clock divider 120 allows the cache memory I/O logic 140 to better synchronize data exchanged over the back side bus 125. Again, as skew is reduced, overall performance may be improved because less time is wasted as guardband.

The frequency of BSBCLK is determined by the frequency of GCLK 109 as well as the mode of the clock divider 112. The frequency of GCLK, in turn, is determined by clock generation logic 108. This clock generation logic 108 generally receives a clock signal (not shown) from the system bus 150. The clock generation logic 108 then may simply distribute or may multiply or divide the clock signal received from the system bus. Much of the logic in the processor 104 operates at the frequency of the global clock signal GCLK 109 which is distributed over local clock networks 110. Initialization logic 128 is coupled by control lines 129 to set the mode, including the clock division ratio, of the various clock divider and strobe generation circuits. This is typically performed at restart of the processor or reset of the overall system.

Figure 2:
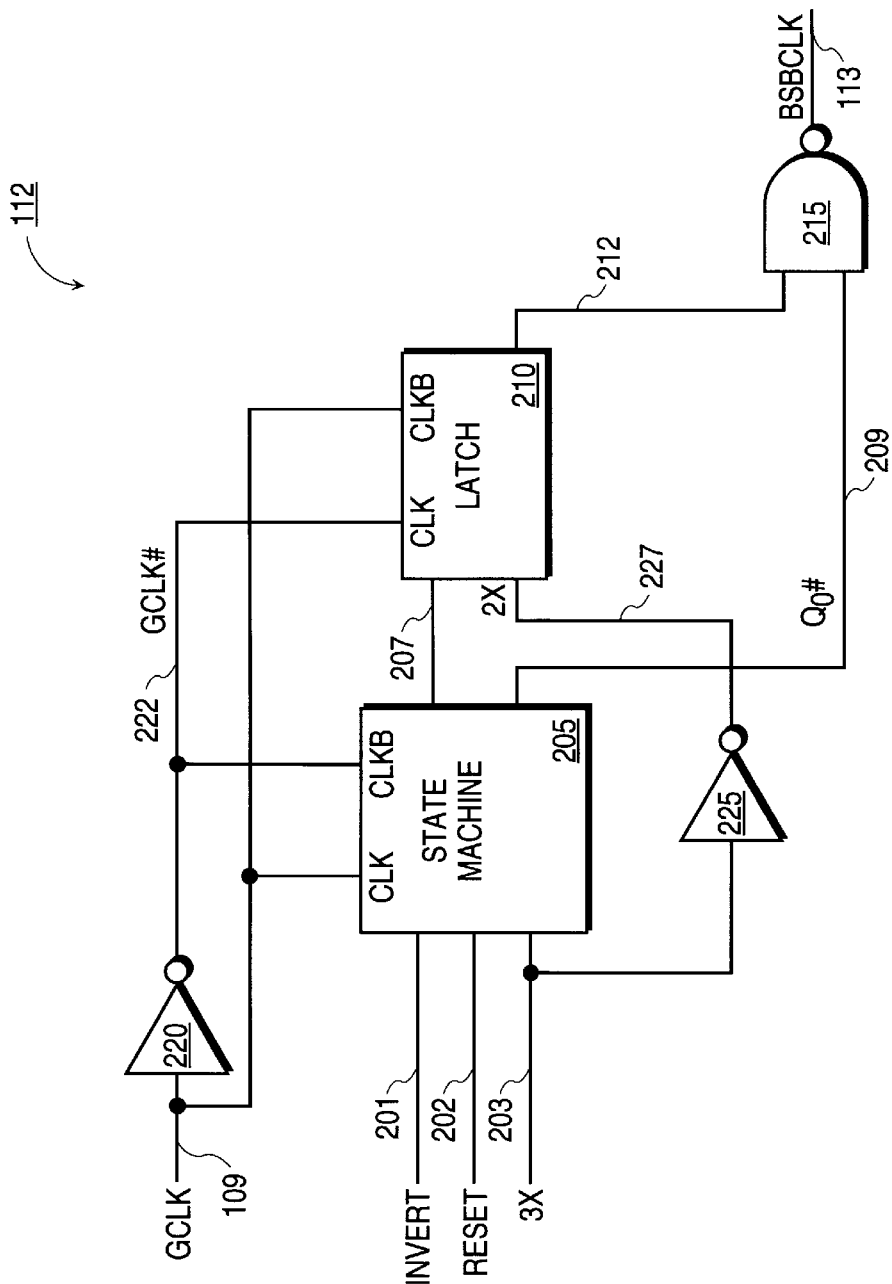
FIG. 2 illustrates an embodiment of the clock divider 112 of FIG. 1.

One embodiment of the clock divider 112 which receives mode, initialization, and phase control signals which may be generated by the initialization logic 128 is illustrated in FIG. 2. This clock divider has a duty cycle of approximately fifty percent, meaning that duty cycle asymmetry, at least at the point BSBCLK is generated, is less than one half clock cycle of the input clock signal, GCLK 109. A state machine 205 and a latch 210 cooperate to produce BSBCLK 113 which is a fraction of an input clock signal, GCLK 109. The state machine 205 selects one of two phase relationships of BSBCLK to GCLK based on an "invert" signal received at input port 201. The first phase relationship is 180° out of phase or inverted with respect to the second phase relationship.

Figure 3:
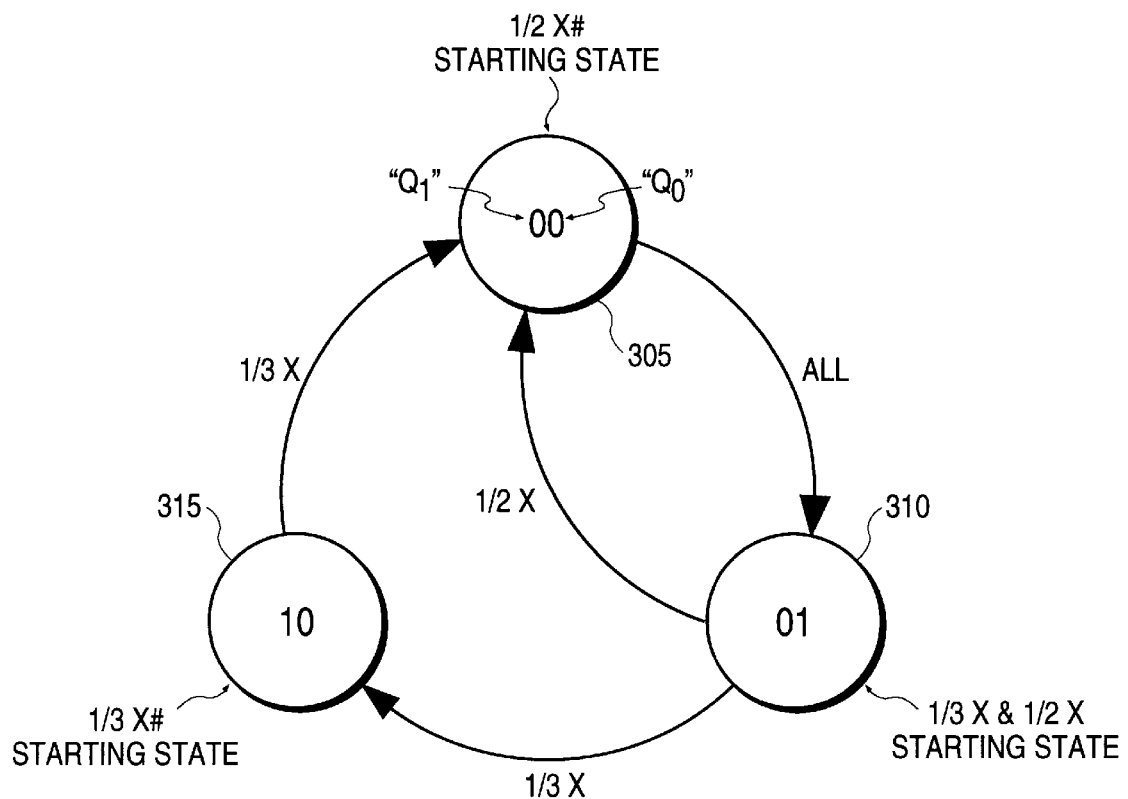
FIG. 3 illustrates an embodiment of a state diagram for the state machine 205 of FIG. 2.

An initialization signal ("reset") received at input port 202 resets the state machine 205 to a known state (e.g., the appropriate "starting state" shown in FIG. 3). A mode select signal ("3×") received at input port 203 selects between a first mode where BSBCLK has a frequency ⅓ that of GCLK, and a second mode where BSBCLK has a frequency ½ that of GCLK.

In the ½× mode, a "2×" signal 227 generated by an inverter 225 which is coupled to receive the 3× signal causes the latch 210 to produce a constant 1 output at latch output 212 such that a NAND gate 215 reflects only the Q0# signal from the state machine 205. In the ⅓× mode, the latch 210 produces output varying based on the output 207 from the state machine 205. In the ⅓× mode, the state machine 205 either sets the rising edge or the falling edge of BSBCLK, with the latch 210 setting the other edge. The invert signal as well as the state machine and latch internal connections to GCLK 109 and GCLK# 222 (as generated from GCLK by an inverter 220) determine which circuit sets which edge.

Details of the operation of the state machine 205 are shown in the state diagram of FIG. 3. States 305, 310, and 315 are respectively represented by the states 00, 01, and 10 of the state variables Q1 and Q0. The state 00 is the ½×# starting state. That is, 00 is the starting state when the ½× mode is selected and the invert signal is asserted. From the 00 state, the state machine 205 transitions to the 01 state regardless of the mode selected. The 01 state is the starting state for both the ⅓× and the ½× modes. From the 01 state, the state machine 205 transitions back to the 00 state if the ½× mode is selected. If the ⅓× mode is selected, the state machine next transitions into the 10 state. From the 10 state, which is also the ⅓×# starting state, the state machine 205 transitions back to the 00 state. Derived from these state variables, the state machine produces its first output 207 and its second output Q0# 209 which are used to generate the output clock, BSBCLK.

Figure 4:
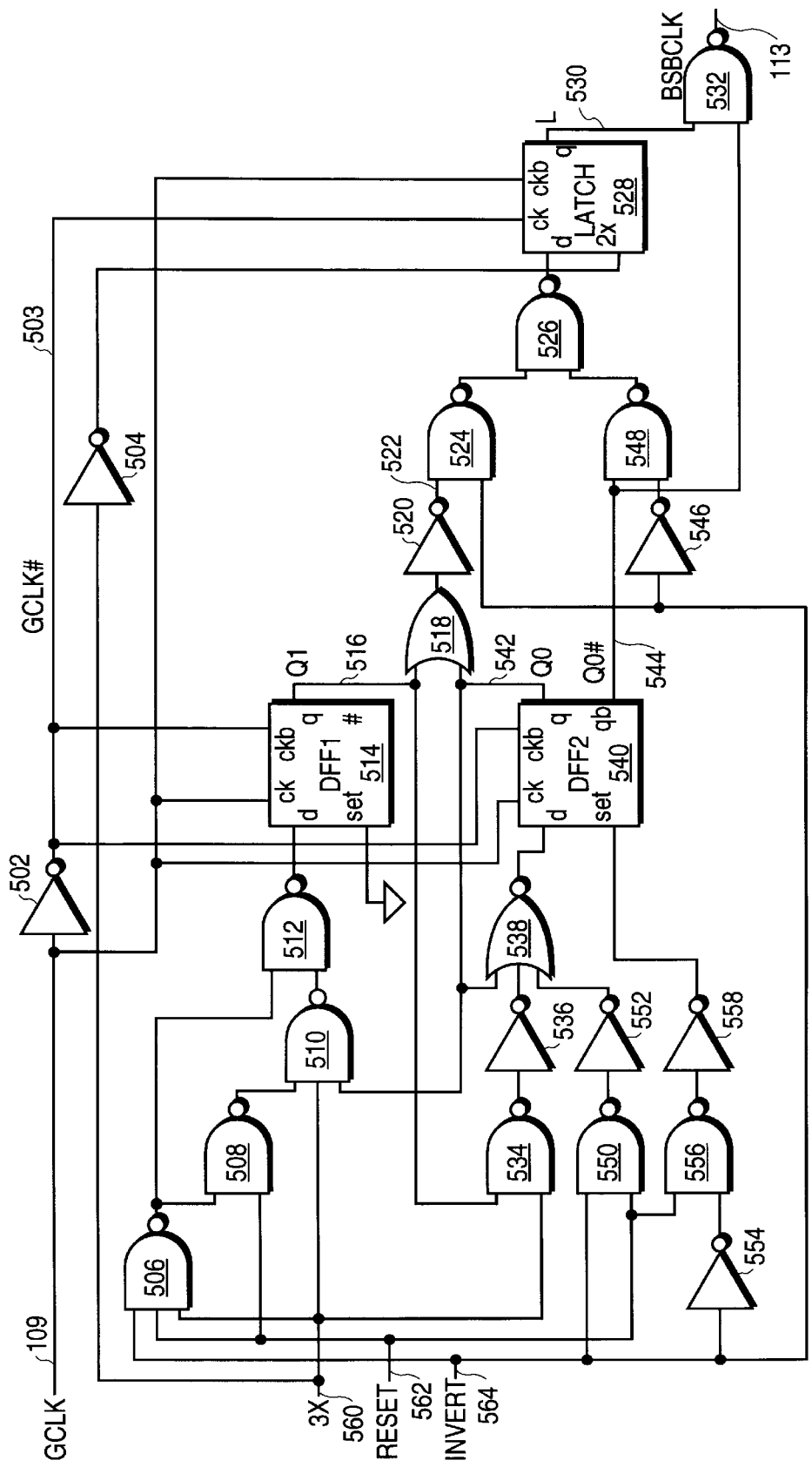
FIG. 4 illustrates further details of one embodiment of a clock divider of the present invention.
Figure 5:
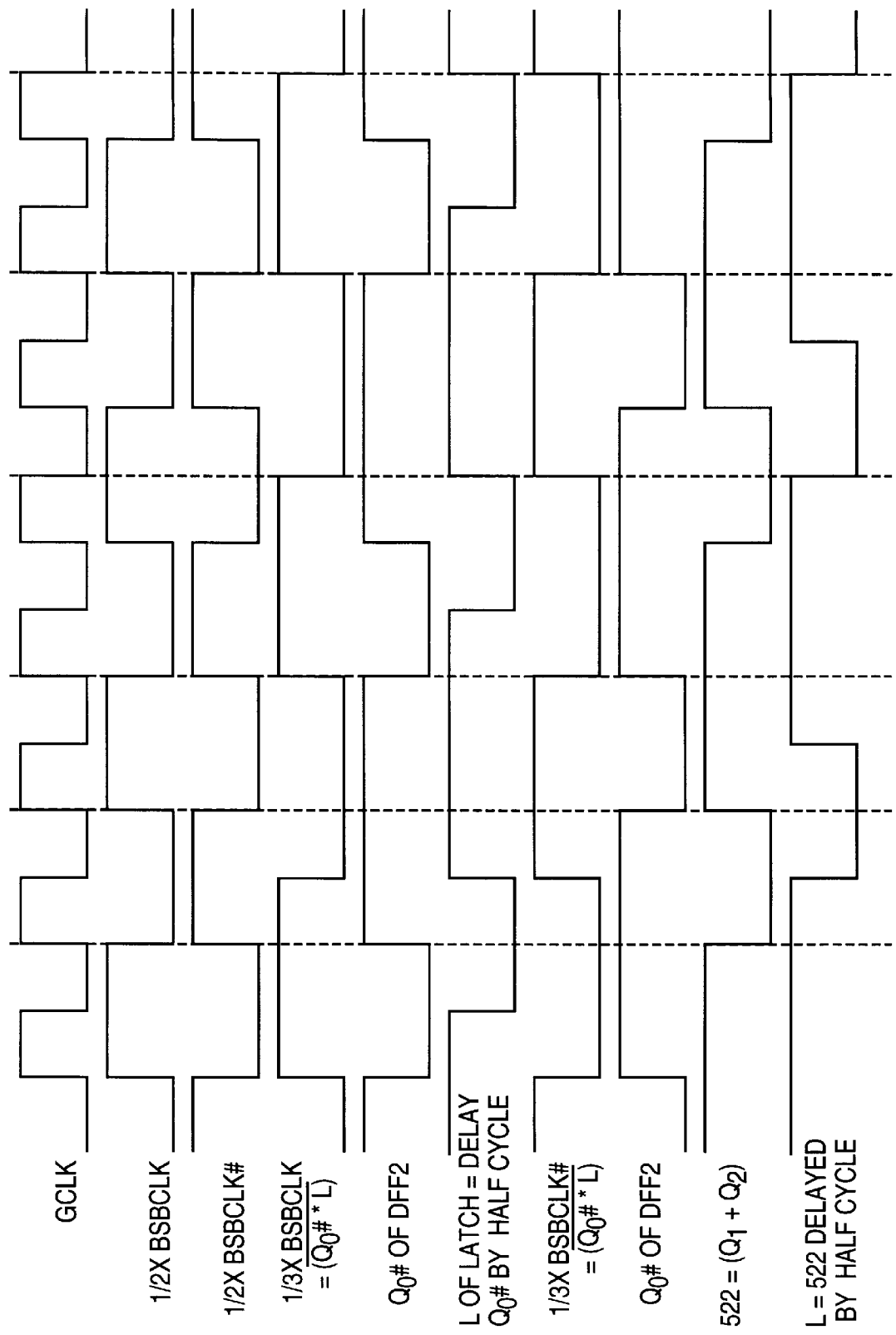
FIG. 5 illustrates waveforms for the clock divider shown in FIG. 4.

The detailed circuit diagram of FIG. 4 and the accompanying waveforms of FIG. 5 illustrate details of one embodiment which generates the desired BSBCLK signal based on the Q0 and Q1 state variables. FIG. 5 illustrates BSBCLK output waveforms for each of the four modes, as indicated by the waveforms marked ½× BSBCLK, ½× BSBCLK#, ⅓× BSBCLK, and ⅓× BSBCLK#. In each case, the global clock signal (GCLK) is divided down and inverted if necessary to generate the proper BSBCLK output.

In the clock divider of FIG. 4, GCLK 109 is inverted by an inverter 502 to produce GCLK# 503. A first D flip-flop 514 and a second D flip-flop 540 each have a clock (CK) input coupled to receive the GCLK signal and a inverted clock (CKB) input coupled to receive the GCLK# signal. A latch 528 has a clock input coupled to receive the GCLK# signal and a inverted clock input coupled to receive the GCLK signal. Three input ports, 560, 562, and 564, respectively receive the 3×, reset, and invert signals.

A NAND gate 506 has a first input coupled to receive the invert signal, a second input coupled to receive the reset signal, and a third input coupled to receive the 3× signal. A NAND gate 508 has a first input coupled to receive the output of the NAND gate 506 and a second input coupled to receive the reset signal. A NAND gate 510 has a first input coupled to receive the output of the NAND gate 508, a second input coupled to receive the 3× signal, and a third input coupled to receive Q0 542, which is an output of the flip-flop 540. A NAND gate 512 has a first input coupled to receive the output of NAND gate 506 and a second input coupled to receive the output of NAND gate 510. The output of NAND gate 512 is then coupled to a data input (D) of flip-flop 514. The flip-flop 514 also has a set input connected to ground and generates the Q1 output signal 516.

A NAND gate 534 has a first input coupled to receive the Q1 signal and a second input coupled to receive the 3× signal. A NOR gate 538 has a first input coupled to receive the Q0 signal, a second output coupled to receive the output of the NAND gate 534 after it is inverted by an inverter 536, and a third input coupled to receive the output of an inverter 552. The input of the inverter 552 is generated by a NAND gate 550 which has a first input coupled to receive the invert signal and a second input coupled to receive the reset signal. A NAND gate 556 has a first input coupled to receive the reset signal and a second input coupled to receive the invert signal after it is inverted by inverter 554. The output of the NAND gate 556 is then inverted by an inverter 558.

The flip-flop 540 has a set input coupled to receive the output of inverter 558, a data input coupled to receive the output of NOR gate 538, and generates the outputs Q0 542 and Q0# 544. An OR function is performed by a NOR gate 518 with a first input coupled to receive the Q1 signal and a second input coupled to receive the Q0 signal followed by an inverter 520 having an output at node 522. A NAND gate 524 has a first input coupled to node 522 and a second input coupled to receive the invert signal. A NAND gate 526 has an input coupled to receive the output of NAND gate 524 and an input coupled to receive the output of NAND gate 548. The NAND gate 548 has a first input coupled to receive the Q0# signal and a second input coupled by an inverter 546 to receive the invert signal.

The latch 528 has a data input coupled to receive the output of NAND gate 526, a 2× input coupled by an inverter 504 to receive the 3× signal, and generates an output L 530. A NAND gate 532 has a first input coupled to receive L and a second input coupled to receive the Q0# signal. This NAND gate 532 then generates BSBCLK 113. Thus, in this embodiment, the BSBCLK signal is generated by the NAND of the Q0# signal and L, the output of latch 528.

For the ⅓× and ⅓×# modes, Q0 and L are illustrated in FIG. 5. Additionally, for the ⅓×# mode, the waveform at node 522 is illustrated. Of course, other logical arrangements having differing waveforms may still generate the appropriate BSBCLK signals in accordance with the present invention.

Figure 6A:
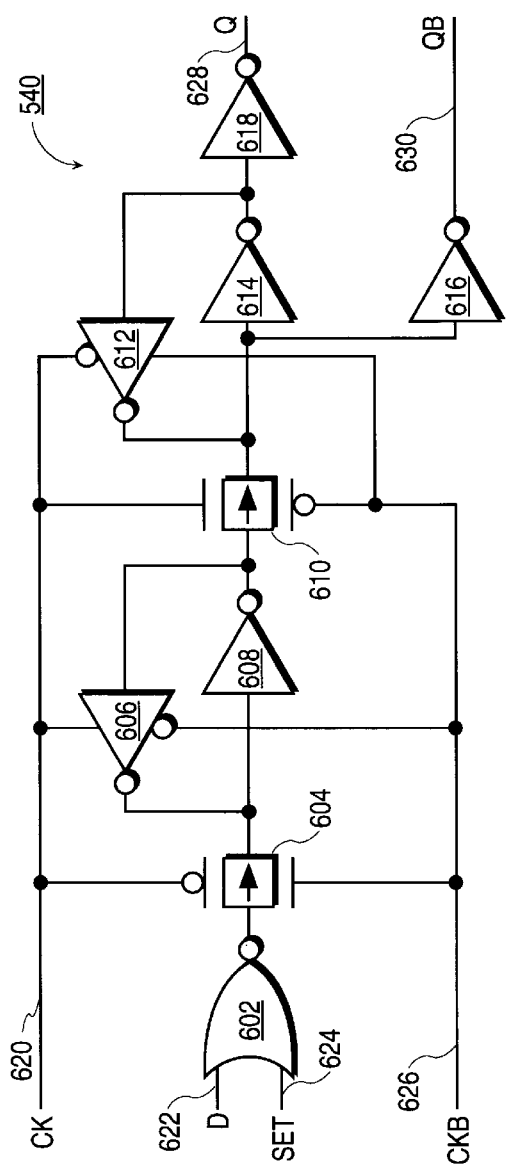
FIGS. 6a and 6b illustrate details of one embodiment of the flip-flop 540 and the latch 528 shown in FIG. 5.
Figure 6B:
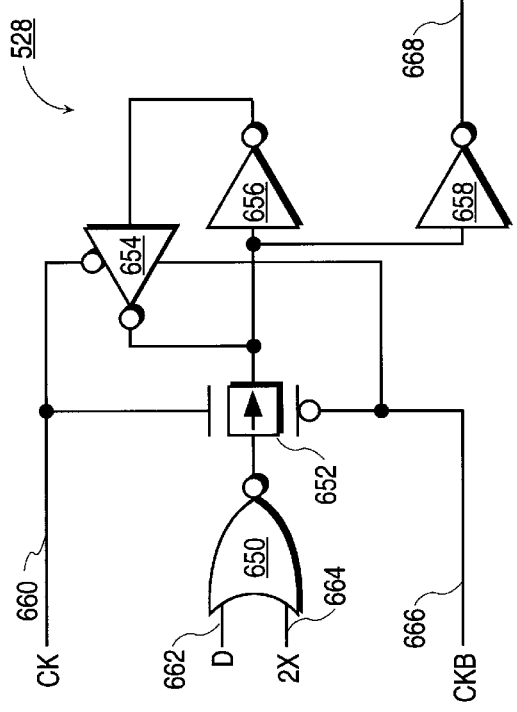

Further details of flip-flop 540 and latch 528 are illustrated in FIGS. 6a and 6b to demonstrate that one embodiment of the invented clock divider circuit has equal gate delays from the clock input port to both rising and falling edges of the generated clock signal. In other words, the number of gate delays from the GCLK input to the BSBCLK output remains the same whether a rising edge of BSBCLK or a falling edge of BSBCLK is being generated. This level of precision is increasingly important as operational frequencies increase and/or available guard bands are decreased to improve performance.

The flip-flop 540, as illustrated in FIG. 6a, has a NOR gate 602 coupled to receive the data (D) and set inputs from input ports 622 and 624 respectively. A pass gate 604 receives the output of the NOR gate 602 and has its active low enable coupled to the CK input port 620 and its active high enabled coupled to the CKB input port 626. The output of the pass gate 604 is driven by an inverter 608 to the input of another pass gate 610. The output of the pass gate 604 is sustained by a tri-state inverter 606 with its active low enable input coupled to CKB and its enable input coupled to CK.

The output of the pass gate 610 is driven by an inverter 614 and another inverter 618 to generate the output (Q) 628 of the flip-flop. A tri-state inverter 612 sustains the output of the pass gate 610, having an active low enable input coupled to CK and an enable input coupled to CKB. The second output of the flip-flop 514 (QB) 630 is driven by an inverter 616 from the output of the pass gate 610.

FIG. 6b illustrates the details of one embodiment of the latch 528. In this case, a NOR gate 650 has a first input coupled to receive the data signal (D) from the data input port 662 and a second input coupled to receive a version of the mode selection signal (2×) from the input port 664. The NOR gate 650 drives its output to a pass gate 652 having an inverted enable coupled to the inverted clock input port (CKB) 666 and an enable coupled to the clock input port (CK) 660. The output of the pass gate 652 is coupled to an inverter 656 which drives a tri-state driver 654 that sustains the output of the pass gate 652 when the pass gate 652 is disabled. Accordingly, the tri-state driver has an active low enable coupled to CK and an enable couple to CKB. The output (Q) 668 is driven by an inverter 658 with its input connected to the output of the pass gate 652. Thus, the latch 528 is a half latch or a single phase latch which drives its output in response to a single clock edge, in this case the signal at CK transitioning high and the signal at CKB transitioning low.

In the embodiment of the clock divider of FIG. 4 using the flip-flop and latch of FIGS. 6a and 6b, equivalent gate delays to the rising and falling edge of the output clock (BSBCLK) are achieved. These delays include propagation through the same number of gates, but involve different clock edges and different types of gates in some cases. Specifically, a rising edge of GCLK causes the flip-flop 540 to enable the pass gate 610 and drive the output QB 630 through the inverter 616. Similarly a falling edge of GCLK at the CKB input port 666 of latch 528 enables the pass gate 652 which drives the output Q 668 through the inverter 658. Each of these sequences involves two gate delays, one from the enabled to the output of a pass gate, and a second from the input to the output of an inverter.

As can be seen from FIG. 4, after the Q0# signal leaves latch 540 and the L signal leaves latch signal 528, each signal propagates through the same NAND gate 532 to generate BSBCLK. Thus, appropriate latch design and careful generation of latch output signals by using proper combinational logic before the latches reduces post latch logic and facilitates the generation of an oddly divided clock having equal gate delays to both rising and falling edges, thereby improving duty cycle symmetry.

In summary, the present invention provides a multiple clock frequency divider with fifty percent duty cycle output. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A clock divider circuit comprising:
   a clock input coupled to receive an input clock signal having an input clock frequency;
   a clock output;
   clock division logic coupled to receive the input clock signal and coupled to generate an output clock signal at the clock output, the output clock signal having approximately a fifty percent duty cycle and an output clock frequency which is an odd fraction of the input clock frequency, the clock division logic generating both rising and falling clock edges of the output clock signal from the input clock signal and having equivalent gate delays from the clock input to the clock output for rising and falling edges of the output clock signal, the clock division logic comprising:
      a state machine coupled to receive the input clock signal, the state machine having a first output and a second output which both transition responsive to a first edge of the input clock signal;
      a latch coupled to receive the first output of the state machine, the latch being coupled to receive the input clock signal and having a latch output which transitions responsive to a second edge of the input clock signal; and
      a logic gate coupled to combine the latch output and the second output of the state machine to produce the output clock signal.

2. The clock divider circuit of claim 1 wherein the first edge of the input clock signal is one of a rising edge and a falling edge, and the second edge is the other of the rising edge and the falling edge.

3. The clock divider circuit of claim 2 wherein the state machine further comprises first and second state machine flip-flops each having master and slave stages, and wherein the latch comprises a single phase latch.

4. A clock divider circuit comprising:
   a clock input for receiving an input clock signal;
   a clock output;
   an invert input for receiving an invert signal;
   a state machine coupled to the clock input, the clock output, and the invert input, the state machine providing an output clock signal at the clock output, the output clock signal being an odd fraction of the input clock signal and having one of a first and second phase relationship relative to the input clock signal as selected by the invert signal.

5. The clock divider circuit of claim 4 wherein the state machine is further coupled to a mode input for receiving a mode state of either a first mode or a second mode, the state machine generating the output clock signal in the first mode, the state machine generating a second output clock signal which is an even fraction of the input clock signal in the second mode.

6. The clock divider circuit of claim 5 wherein the state machine is capable of transitioning between a first state, a second state, and a third state, the first state being a ½×# starting state, the second state being a ⅓× and ½× starting state, and the third state being a ⅓×# starting state.

7. The clock divider circuit of claim 6 wherein the state machine transitions from the first state to the second state in the first mode and the second mode.

8. The clock divider circuit of claim 7 wherein the state machine transitions from the second state to the third state in the first mode, and wherein the state machine transitions between the second state and the first state in the second mode.

9. The clock divider circuit of claim 8 wherein the state machine transitions from the third state to the first state in the first mode.

10. The clock divider circuit of claim 4 wherein the state machine is further coupled to a reset input for receiving a reset signal, the state machine being coupled to return to a known state responsive to the reset signal.

11. A system comprising:
   a processor operating at a first frequency, the processor comprising:
      a first clock division circuit coupled to receive a first clock signal at the first frequency and to generate a second clock signal at a second frequency which is an odd fraction of the first frequency;
      an input/output buffer coupled to exchange data using a processor output, the data being driven synchronous to the second clock signal;
      a second clock division circuit coupled to receive the first clock signal and to generate a strobe signal for the input/output buffer at the second frequency; and
   a memory circuit coupled to the processor and including input/output logic having an input/output port coupled to exchange data with the processor, the memory circuit being coupled to receive the second clock signal to synchronize transmission of data between the processor and the memory circuit.

12. The system of claim 11 wherein the memory circuit also drives data and the processor receives data synchronized to the second clock signal.

13. The system of claim 11 wherein the clock division circuit comprises clock division logic having equivalent gate delays from the first clock signal to rising and falling edges of the second clock signal.

14. The system of claim 11 wherein the clock division circuit comprises a state machine having a mode input for receiving a mode input signal, wherein the state machine generates the second clock signal at the odd fraction of the first clock signal responsive to a first state of the mode input signal, and wherein the state machine generates the second clock signal as an even fraction of the first clock signal responsive to a second state of the mode input signal.

15. The system of claim 11 wherein the memory circuit is a cache memory circuit and wherein the processor is coupled to the cache memory circuit by a bus.

16. The system of claim 15 wherein the processor further comprises a global clock generation circuit for generating the first clock signal, the first clock signal being coupled to the plurality of clock division circuits.

17. A method of generating a clock signal having approximately a fifty percent duty cycle, comprising the steps of:

receiving an input clock signal having an input clock frequency;

selecting a phase relationship between the input clock signal and the output clock signal;

generating a rising edge of an output clock signal from one of a rising edge or a falling edge of the input clock signal;

generating a falling edge of the output clock signal from the other of the rising edge and the falling edge of the input clock signal through an equivalent gate delay to that through which the rising edge of the output clock signal is generated such that the output clock signal has an output clock frequency which is an odd fraction of the input clock frequency.

18. The method of claim 17 further comprising the step of asserting a reset signal to reset the output clock signal to a known state.

19. An apparatus comprising:

a processor having a bus interface, the processor including a plurality of clock division circuits coupled to generate a plurality of bus clock signals that operate at a frequency which is an odd fraction of a global clock frequency of the processor, each of the plurality of clock division circuits having equivalent gate delays from a global clock input for rising and falling edges of a respective bus clock;

a cache memory coupled to receive the plurality of bus clock signals and coupled to the bus interface of the processor to communicate with the processor at the frequency which is the odd fraction of the global clock frequency of the processor.

20. The apparatus of claim 19 wherein one of the plurality of clock division circuits receives an asserted invert control signal and produces a bus clock signal which is an inverted bus clock signal.

21. The apparatus of claim 19 wherein the processor further comprises:

a first clock division circuit coupled to generate a first strobe signal that operates at the frequency which is the odd fraction of the global clock frequency of the processor;

a second clock division circuit coupled to generate a second strobe signal that operates at the frequency which is the odd fraction of the global clock frequency of the processor;

a first plurality of buffer circuits coupled to receive the first strobe signal to synchronize communication with the cache memory; and a second plurality of buffer circuits coupled to receive the second strobe signal to synchronize communication with the cache memory.

* * * * *